US010763562B2

(12) United States Patent
Deriso

(10) Patent No.: US 10,763,562 B2
(45) Date of Patent: *Sep. 1, 2020

(54) DIELECTRIC-FILLED SURFACE-MOUNTED WAVEGUIDE DEVICES AND METHODS FOR COUPLING MICROWAVE ENERGY

(71) Applicant: SKYWORKS SOLUTIONS, INC., Woburn, MA (US)

(72) Inventor: John Christopher Deriso, Herndon, VA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/985,894

(22) Filed: May 22, 2018

(65) Prior Publication Data

US 2018/0342778 A1    Nov. 29, 2018

Related U.S. Application Data

(63) Continuation of application No. 15/055,636, filed on Feb. 29, 2016, now Pat. No. 9,979,062.

(60) Provisional application No. 62/127,955, filed on Mar. 4, 2015.

(51) Int. Cl.
| H01P 1/20 | (2006.01) |
| H01P 1/208 | (2006.01) |
| H01P 11/00 | (2006.01) |
| H01P 5/107 | (2006.01) |
| H01P 3/16 | (2006.01) |
| H04B 1/40 | (2015.01) |
| H05K 1/02 | (2006.01) |
| H01P 3/12 | (2006.01) |

(52) U.S. Cl.
CPC .......... *H01P 1/2002* (2013.01); *H01P 1/2088* (2013.01); *H01P 3/16* (2013.01); *H01P 5/107* (2013.01); *H01P 11/006* (2013.01); *H01P 11/007* (2013.01); *H04B 1/40* (2013.01); *H05K 1/0243* (2013.01); *H01P 3/122* (2013.01)

(58) Field of Classification Search
CPC .... H01P 1/2002; H01P 1/2053; H01P 1/2056; H01P 11/007
USPC ........................................................ 333/208
See application file for complete search history.

(56) References Cited

U.S. PATENT DOCUMENTS

| 6,133,808 A | 10/2000 | Arakawa |
| 6,498,550 B1 | 12/2002 | Miller et al. |
| 9,979,062 B2 * | 5/2018 | Deriso ................ H01P 1/2002 |

(Continued)

FOREIGN PATENT DOCUMENTS

| FR | 2462787 A1 | 2/1981 |
| TW | 535326 B | 6/2003 |

*Primary Examiner* — Benny T Lee
(74) *Attorney, Agent, or Firm* — Chang & Hale LLP

(57) ABSTRACT

Waveguide devices and methods for radio-frequency applications. In some embodiments, a radio-frequency waveguide can include a dielectric block having a first edge that joins a mounting surface and a first adjacent surface. The waveguide can further include a conductive coating that substantially covers the dielectric block, and defining a wrap-around opening that exposes the dielectric block along the first edge. The wrap-around opening can include a strip on the first adjacent surface along the first edge and a strip on the mounting surface along the first edge, such that the first edge of the dielectric block is continuously exposed within the wrap-around opening.

19 Claims, 10 Drawing Sheets

(56) References Cited

U.S. PATENT DOCUMENTS

2002/0190821 A1 12/2002 Tada et al.
2003/0231081 A1 12/2003 Yonekura et al.
2004/0085151 A1 5/2004 Fukunaga

* cited by examiner

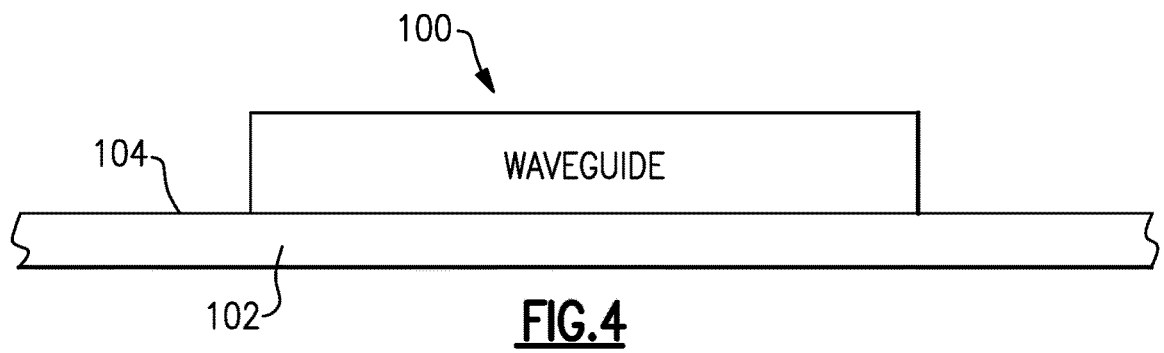
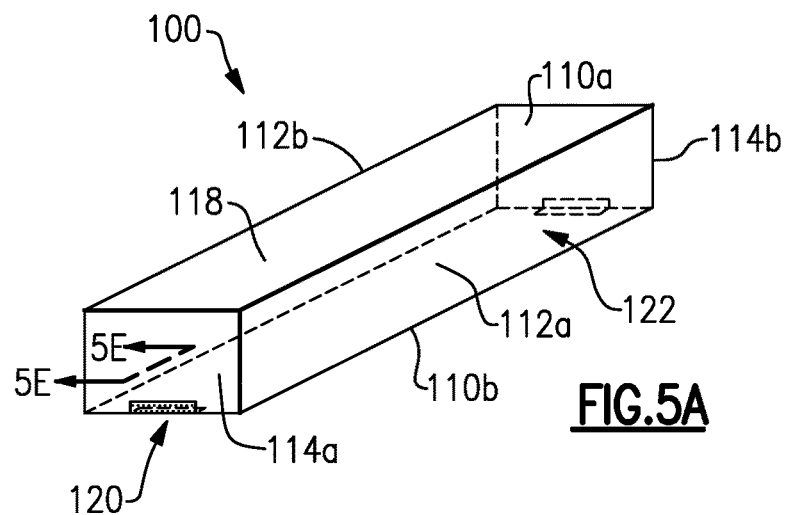
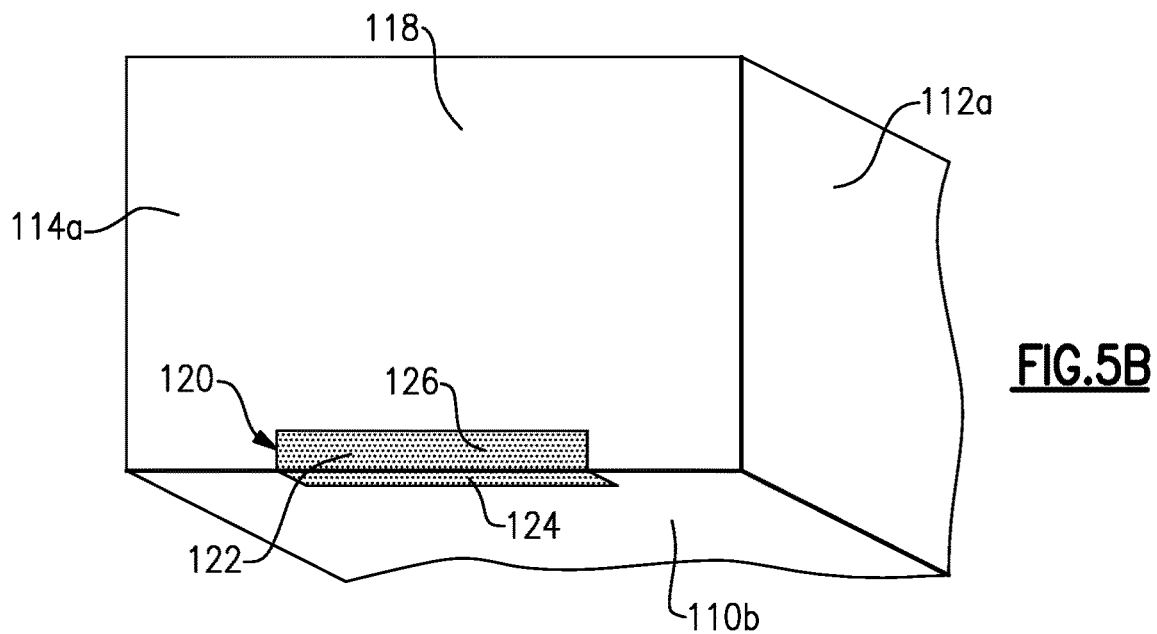

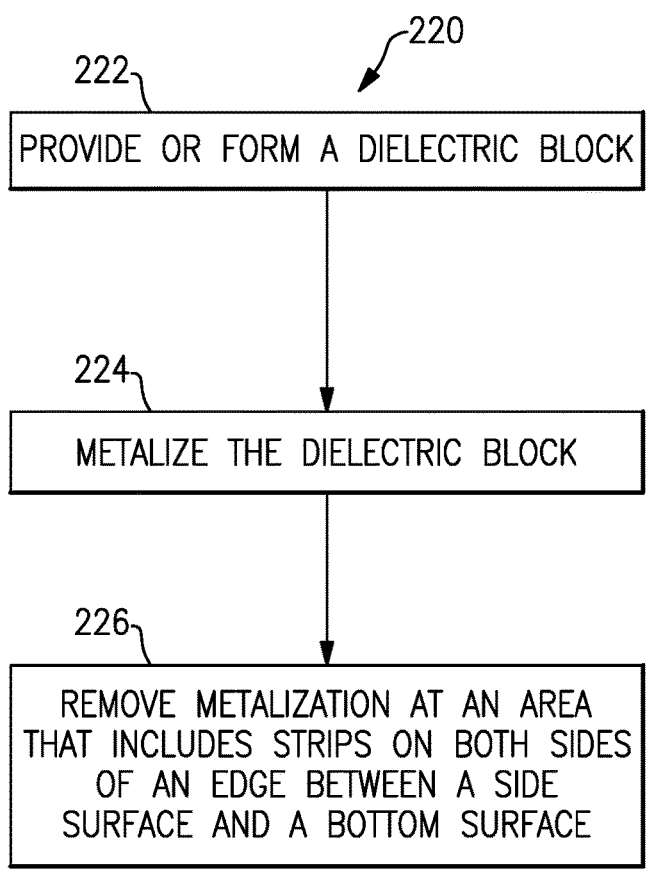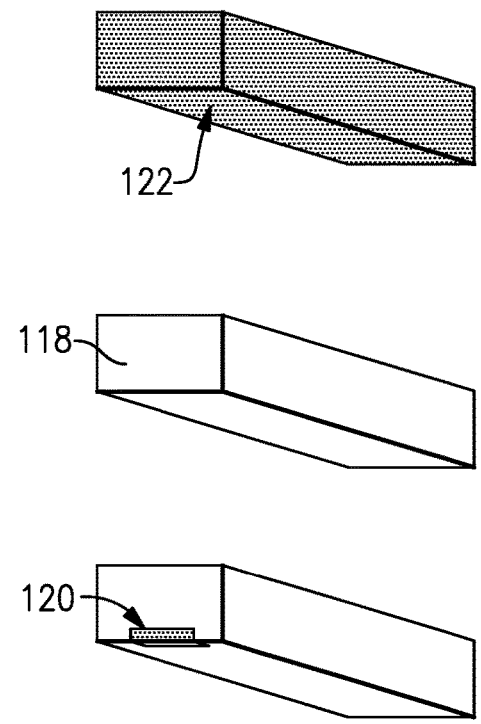
FIG. 10
FIG. 11

DIELECTRIC-FILLED SURFACE-MOUNTED WAVEGUIDE DEVICES AND METHODS FOR COUPLING MICROWAVE ENERGY

CROSS-REFERENCE TO RELATED APPLICATION(S)

This application is a continuation of U.S. application Ser. No. 15/055,636 filed Feb. 29, 2016, entitled DIELECTRIC-FILLED SURFACE-MOUNTED WAVEGUIDE DEVICES AND METHODS FOR COUPLING MICROWAVE ENERGY, which claims priority to and the benefit of the filing date of U.S. Provisional Application No. 62/127,955 filed Mar. 4, 2015, entitled DEVICES AND METHODS FOR COUPLING MICROWAVE ENERGY WITH A DIELECTRIC-FILLED SURFACE-MOUNTED WAVEGUIDE, the benefits of the filing dates of which are hereby claimed and the disclosures of which are hereby expressly incorporated by reference herein in their entirety.

BACKGROUND

Field

The present disclosure relates to waveguide devices and methods for microwave applications.

Description of the Related Art

In some microwave applications, a signal can be routed and/or processed between two nodes. In some situations, such routing and/or processing of the signal can be facilitated by a radio-frequency waveguide.

SUMMARY OF THE INVENTION

In accordance with a number of implementations, the present disclosure relates to a radio-frequency (RF) waveguide that includes a dielectric block having a first edge that joins a mounting surface and a first adjacent surface. The RF waveguide further includes a conductive coating that substantially covers the dielectric block. The conductive coating defines a wrap-around opening that exposes the dielectric block along the first edge. The wrap-around opening includes a strip on the first adjacent surface along the first edge and a strip on the mounting surface along the first edge.

In some embodiments, the mounting surface can include a bottom surface when the RF waveguide is oriented to be mounted. The dielectric block can have a rectangular box shape. The adjacent surface can include an end wall surface. The conductive coating can further define a second wrap-around opening along a second edge that joins the bottom surface and a second end wall surface that is opposite the first end wall surface. The second wrap-around opening can expose the corresponding portion of the dielectric block.

In some embodiments, the adjacent surface can include a side wall surface. The wrap-around opening can be implemented near a corresponding end of the rectangular box shape. The conductive coating can further define a second wrap-around opening along the first edge near the other end of the rectangular box shape. The second wrap-around opening can expose the corresponding portion of the dielectric block.

In some embodiments, the wrap-around opening can be configured to allow a signal trace on a surface of a circuit board to extend underneath the wrap-around opening and couple to the wrap-around opening. The wrap-around opening can allow coupling with the signal trace without shorting with another portion of the conductive coating about the wrap-around opening. The wrap-around opening can be configured to allow one or more grounding connections to be made on the surface of the circuit board. The wrap-around opening can be dimensioned to allow the grounding connections to be made at both ends of the strip on the bottom surface along the first edge.

In some embodiments, the dielectric block can include, for example, ceramic material.

In some teachings, the present disclosure relates to a method for fabricating a radio-frequency (RF) waveguide. The method includes forming or providing a dielectric block having a first edge that joins a mounting surface and a first adjacent surface. The method further includes covering the dielectric block with a conductive material to define a wrap-around opening that exposes the dielectric block along the first edge. The wrap-around opening includes a strip on the first adjacent surface along the first edge and a strip on the mounting surface along the first edge.

In some embodiments, the covering includes masking an area corresponding to the wrap-around opening, metallizing the dielectric block, and removing the mask to yield the wrap-around opening. In some embodiments, the covering includes metallizing the dielectric block, and removing the metallization at an area corresponding to the wrap-around opening.

According to some implementations, the present disclosure relates to a radio-frequency (RF) device that includes a substrate configured to receive one or more components, and an RF waveguide mounted on the substrate. The RF waveguide includes a dielectric block having a first edge that joins a mounting surface and a first adjacent surface. The RF waveguide further includes a conductive coating that substantially covers the dielectric block. The conductive coating defines a wrap-around opening that exposes the dielectric block along the first edge. The wrap-around opening includes a strip on the first adjacent surface along the first edge and a strip on the mounting surface along the first edge.

In some embodiments, the RF device can further include a signal trace implemented substantially on a surface of the substrate. The signal trace can have an end configured to form a direct electrical contact with the conductive coating of the RF waveguide at or near an edge of the strip on the mounting surface of the RF waveguide. In some embodiments, the RF device can further include one or more ground traces implemented substantially on the surface of the substrate. Each ground trace can have an end configured to form a direct electrical contact with the conductive coating at or near an end of the strip on the mounting surface of the RF waveguide.

In some embodiments, the substrate can include, for example, a circuit board. In some embodiments, the RF device can be, for example, an RF filter.

In some implementations, the present disclosure relates to a wireless device that includes a transceiver configured to process radio-frequency (RF) signals, and an antenna in communication with the transceiver and configured to facilitate either or both of transmitting of an amplified RF signal and receiving of an incoming signal. The wireless device further includes an RF component implemented between the transceiver and the antenna. The RF component includes a substrate and an RF waveguide mounted on the substrate. The RF waveguide includes a dielectric block having a first edge that joins a mounting surface and a first adjacent surface. The RF waveguide further includes a conductive coating that substantially covers the dielectric block. The conductive coating defines a wrap-around opening that exposes the dielectric block along the first edge. The wrap-around opening includes a strip on the first adjacent surface along the first edge and a strip on the mounting surface along the first edge.

In accordance with some implementations, the present disclosure relates to circuit board that includes a substrate having a surface and configured to receive a radio-frequency (RF) waveguide. The circuit board further includes a signal trace implemented substantially on the surface. The signal trace has an end configured to form a direct electrical contact with a conductive coating of the waveguide at or near a bottom edge of a wrap-around opening at a bottom edge at a first end of the waveguide. The circuit board further includes ground traces implemented substantially on the surface and having ends configured to form a direct electrical contact with the conductive coating at or near opposing ends of the wrap-around opening at the bottom edge.

In some embodiments, the signal trace can be dimensioned to include a portion that extends in a direction having a component parallel with a longitudinal axis of the waveguide such that the portion crosses the bottom edge of the wrap-around opening. The direction of the portion of the signal trace can be substantially parallel with the longitudinal axis of the waveguide. Each of the ground traces can be dimensioned to include a portion that extends in a direction having a component parallel with the longitudinal axis of the waveguide. The direction of the portion of each ground trace can be substantially parallel with the longitudinal axis of the waveguide.

In some teachings, the present disclosure relates to a method for fabricating a circuit board. The method includes forming or providing a substrate having a surface and configured to receive a radio-frequency (RF) waveguide. The method further includes implementing a signal trace substantially on the surface, with the signal trace having an end configured to form a direct electrical contact with a conductive coating of the waveguide at or near a bottom edge of a wrap-around opening at a bottom edge at a first end of the waveguide. The method further includes laying out ground traces substantially on the surface and having ends configured to form a direct electrical contact with the conductive coating at or near opposing ends of the wrap-around opening at the bottom edge.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 4 shows that a waveguide device having one or more features as described herein can be configured to be mounted to a surface of a mounting substrate.

FIG. 5A shows an example configuration of a waveguide device having a surface-mounting capability.

FIG. 5B shows a more detailed perspective view of one end of the waveguide device of FIG. 5A.

FIG. 10 shows another process that can be implemented to fabricate a waveguide device having one or more features as described herein.

FIG. 11 shows examples of various stages corresponding to the process of FIG. 10.

DETAILED DESCRIPTION OF SOME EMBODIMENTS

The headings provided herein, if any, are for convenience only and do not necessarily affect the scope or meaning of the claimed invention.

Dielectric-filled (e.g. ceramic) waveguide devices such as filters are typically designed with connectors having center conductor pins which penetrate the ceramic volume. Such a configuration typically cannot be surface-mounted without cables from the connectors.

In some implementations, the present disclosure relates to devices and methods that can eliminate or reduce the need for connectors for a dielectric waveguide so as to provide a true surface-mount device mountable on, for example, a printed circuit board. One or more of such surface-mount dielectric waveguide devices can be utilized as, for example, radio-frequency (RF) filters, waveguide components, dielectric-filled cavity resonators, etc.

Figure 1:
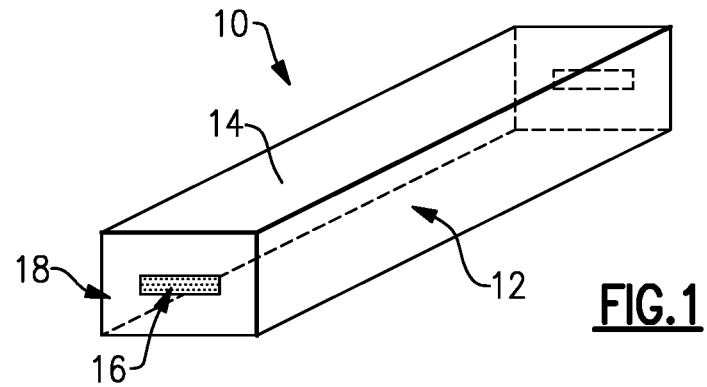
FIG. 1 shows a waveguide device having a block shaped dielectric material and a conductive coating.
Figure 2:
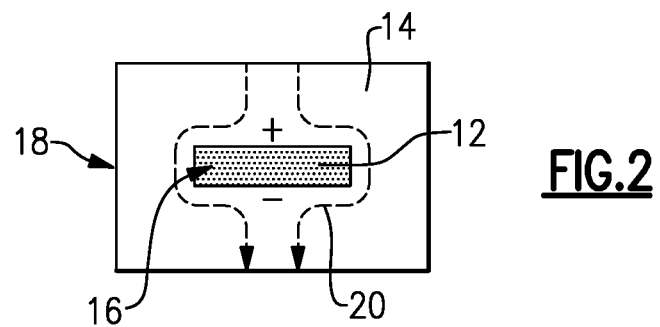
FIG. 2 shows an example electric field pattern that can form when a radio-frequency (RF) current is diverted by a slot implemented on the conductive coating.
Figure 3:
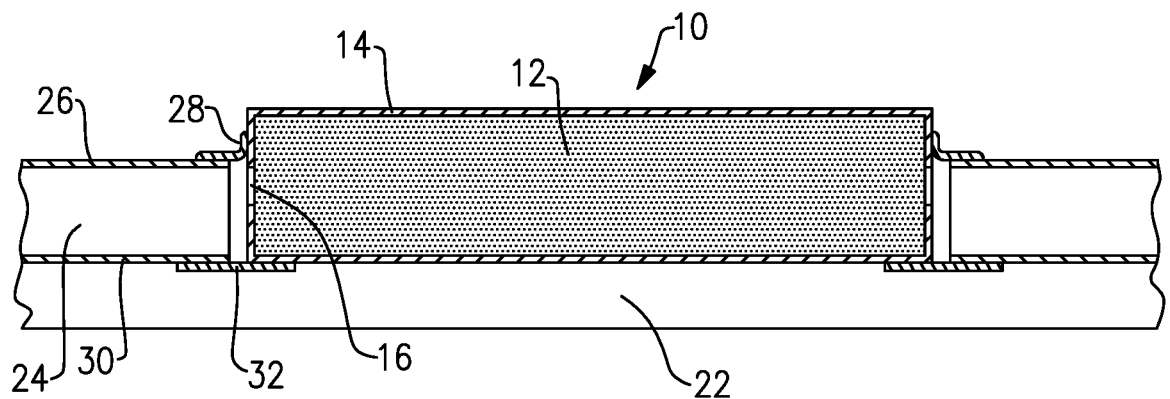
FIG. 3 shows the waveguide device of FIG. 1 mounted on a substrate.

FIGS. 1-3 show a waveguide device 10 having a block shaped dielectric material 12 and a conductive coating 14. A slot 16 is shown to be formed approximately at the center of each end 18 to expose the dielectric material 12. Accordingly, the waveguide device 10 can provide radio-frequency (RF) waveguide functionality between the two end slots 16.

FIG. 2 shows an example electric field pattern 20 that can form when an RF current is diverted by the slot 16 of the waveguide device 10 of FIG. 1. Based on such an electric field, a voltage can be produced as shown across the slot 16 between "+" and "−" polarities. Conversely, if an RF voltage is impressed across the slot 16, an RF current can be produced in the waveguide.

FIG. 3 shows the waveguide device 10 of FIGS. 1 and 2 mounted on a substrate 22. The bottom portion of each end of the waveguide device 10 is shown to be coupled to a grounding trace 30 through a grounding pad 32. To generate the foregoing RF excitation at the slot 16, a conductor 28 (which is electrically connected to a signal trace 26) typically needs to be in contact with the conductive coating 14 above the slot 16. In the example of FIG. 3, such a raised height of the conductor 28 and the signal trace 26 can be facilitated by a dielectric layer 24.

In the example of FIG. 3, one can see that the waveguide device 10 typically requires connection features that are raised above the mounting surface. Accordingly, the example waveguide device 10 is not a pure surface mount device in which couplings between a waveguide device and a mounting substrate can be achieved through connection features that are generally on or below the surface of the mounting substrate.

FIG. 4 shows that a waveguide device 100 having one or more features as described herein can be configured to be mounted to a surface 104 of a mounting substrate 102 such as a packaging substrate, a printed circuit board, etc. As described herein, such a waveguide (100) can be configured so as to be coupled to the mounting substrate 102 through connection features that are generally on or below the surface 104.

Figure 5C:
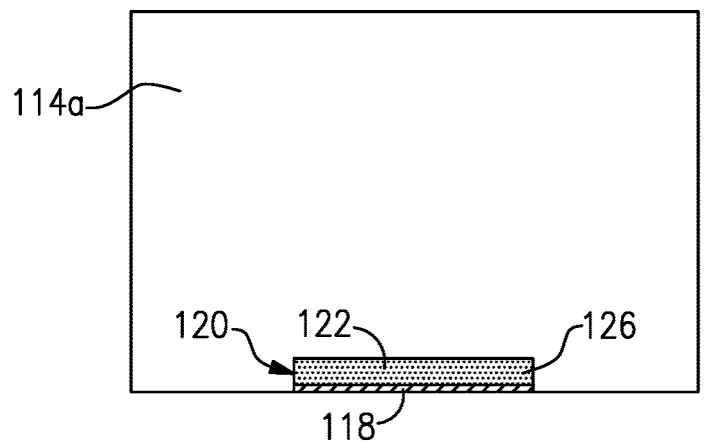
FIG. 5C shows an end view of the waveguide device of FIG. 5A.
Figure 5D:
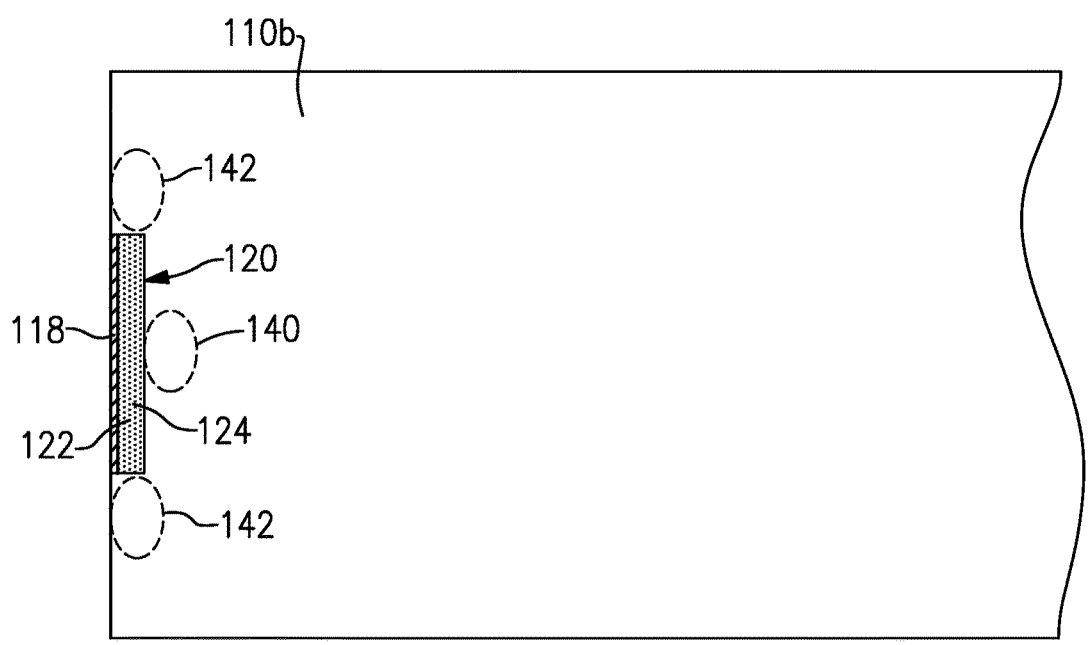
FIG. 5D shows a bottom view of the same end of the waveguide device of FIG. 5A.
Figure 5E:
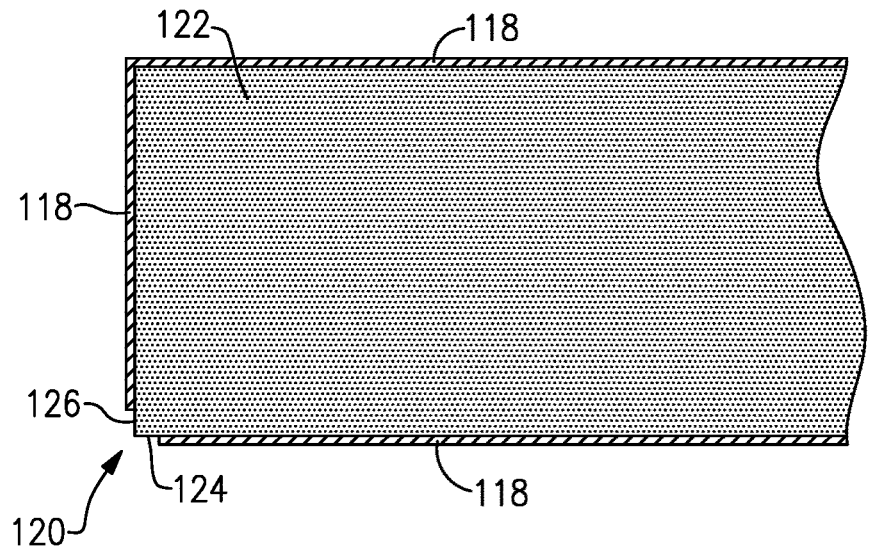
FIG. 5E shows a sectional view of the waveguide device of FIG. 5A.

FIG. 5A shows an example configuration of a waveguide device 100 having the foregoing surface-mounting capability. FIGS. 5B-5E show closer details of one end of the waveguide device 100 of FIG. 5A. More particularly, FIG. 5B shows a more detailed perspective view of one end, FIG. 5C shows an end view of the same end, FIG. 5D shows a bottom view of the same end, and FIG. 5E shows a sectional view indicated as "5E-5E" in FIG. 5A. Although the waveguide device 100 is described in the context of a block shape, it will be understood that one or more features of the present disclosure can also be implemented in other shaped waveguide devices.

Referring to FIGS. 5A-5E, the waveguide device 100 is shown to include a dielectric block 122 mostly covered by a conductive layer 118, so as to define respective upper and lower surfaces 110a (FIG. 5A), 110b (FIGS. 5A, 5B and 5D), side wall surfaces 112a (FIGS. 5A and 5B), 112b (FIG. 5A), and end wall surfaces 114a (FIGS. 5A-5C), 114b (FIG. 5A). An opening 120 in the conductive layer 118 is shown to include a strip 126 (FIGS. 5B, 5C and 5E) along the bottom edge of the end wall 114a, and a similar strip 124 (FIGS. 5B, 5C and 5D) along the end edge of the lower surface 110b. In some embodiments, such strips (126, 124) can be generally contiguous, such that the opening 120 is a single opening. Accordingly, and as shown in a sectional view of FIG. 5E, the opening 120 is shown to expose the dielectric block 122 along the lower end edge in a wrap-around manner. A similar opening is shown to be implemented along the lower edge of the other end.

In the example shown in FIGS. 5A-5E, the strips 126, 124 of the opening 120 are depicted as generally having same lengths. It will be understood that such strips may or may not have same lengths. It will also be understood that widths of such strips may or may not be the same. It will also be understood that dimensions of openings 120 implemented at two ends of the waveguide device 100 may or may not be the same.

Figure 6:
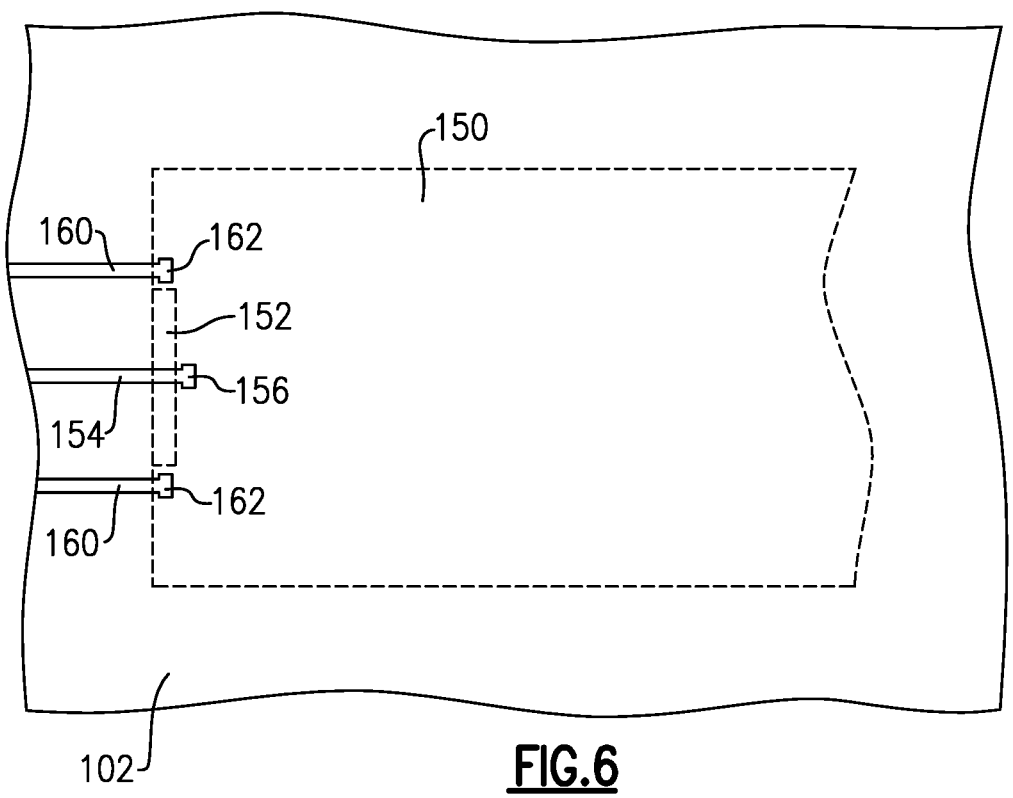
FIG. 6 shows a plan view of a circuit board having conductive traces and their respective contact pads.
Figure 7:
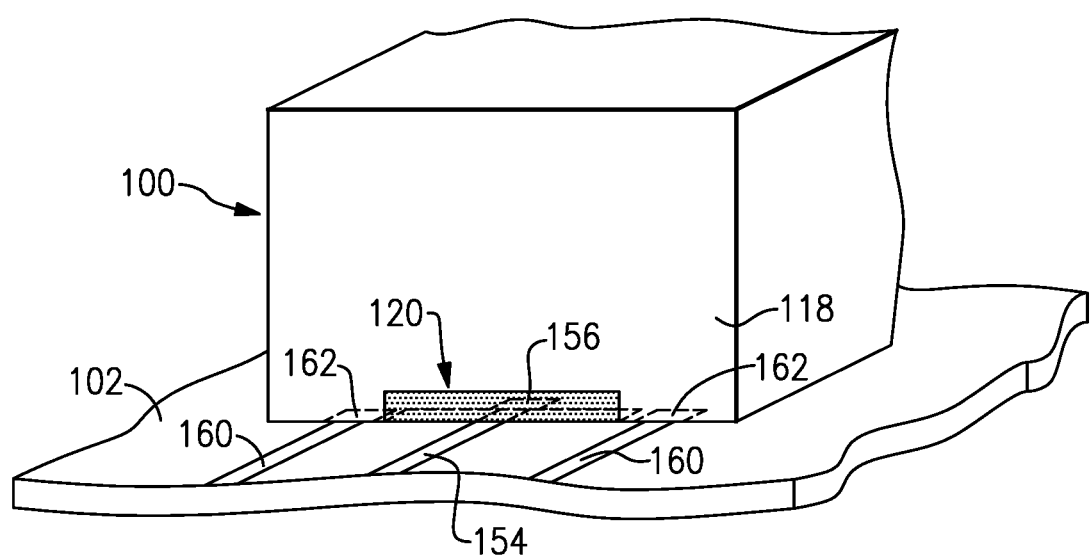
FIG. 7 shows a perspective view of a waveguide device having one or more features as described herein, positioned on the circuit board of FIG. 6.

In some embodiments, a wrap-around opening 120 of FIGS. 5A-5E can be coupled to an RF line as shown in an example of FIGS. 6 and 7. FIG. 6 shows a plan view of a circuit board 102 having conductive traces 154, 160 and their respective contact pads 156, 162. An outline 150 of the waveguide device and an outline 152 of the wrap-around slot (120 in FIG. 7) are shown to indicate how the wrap-around slot 120 can be positioned relative to the contact pads 156, 162. FIG. 7 shows a perspective view of the waveguide device 100 positioned on the circuit board 102 in the foregoing manner.

As shown in FIGS. 6 and 7, the trace 154 can be a signal trace. Such a signal trace can extend under the bottom wall portion (e.g., the strip 124 of FIGS. 5B, 5D and 5E) of the wrap-around opening 120 (FIG. 7) so as to allow the contact pad 156 to form an electrical connection with the conductive layer 118 (FIG. 7) of the bottom wall 110b (FIGS. 5A and 5B). Because the wrap-around opening 120 is not covered by the conductive layer 118, such a connection through the signal trace 154 can be achieved without shorting issues.

In the example of FIGS. 6 and 7, the traces 160 on both sides of the signal trace 154 can be grounding traces. Each of the grounding traces 160 can couple to the conductive layer 118 of the bottom wall 110b at or near the end of the wrap-around opening 120, through the corresponding contact pad 162.

In some embodiments, grounding features can be implemented so as to form electrical contact with the conductive layer 118 of the end wall (e.g., 114a in FIGS. 5B and 5C) at or near the end of the wrap-around opening 120. Although such grounding features may be raised above the surface of the circuit board 102, such heights can be kept at a minimum or a reduced value, since the wrap-around opening 120 is along the lower edge of the end wall.

Accordingly, the foregoing contact pads for the signal (156) and the ground (162) can provide coupling with the underside of the waveguide device 100 at locations generally indicated as 140 and 142 in FIG. 5D. Thus, one can see that the waveguide device 100 can be functionally mounted on a substrate such as a circuit board in a true surface-mount manner without necessarily having to rely on raised features.

In some embodiments, the dimensions of the wrap-around slots can be selected to, for example, determine the degree of coupling to and/or from the waveguide device 100.

In some embodiments, a waveguide device 100 having one or more features as described herein in reference to FIGS. 4, 5A-5E, 6 and 7 can eliminate or significantly lower costs associated with connectors and/or connection features. Further, use of such a waveguide device can eliminate or significantly reduce a difficult problem of penetrating the dielectric and affixing the connector(s) to the waveguide.

In various examples described herein, a dielectric block or the corresponding waveguide device itself is sometimes described in terms of a lower or bottom side, surface, edge, etc. It will be understood that such a usage assumes that the waveguide device is in its mounting or mounted orientation relative to a substrate facing upward. Accordingly, it will be understood that such terms can include relative orientation of the waveguide device with the corresponding substrate. For example, if a waveguide device is mounted on a substrate facing downward, the "lower" or "bottom" terms used herein can be understood to include an upper or top portion of the waveguide device oriented in such a manner.

As described herein, a term "adjacent surface" is sometimes used. It will be understood that such an adjacent surface can include a surface that is joined to another surface by an edge. For example, in the context of a rectangular block shape, each of four side walls (two along the length of the block, and two ends) can define an adjacent surface relative to a bottom surface. If the bottom surface is a mounting surface, then each of the four side wall surfaces can be an adjacent surface relative to the mounting surface.

Figure 8:
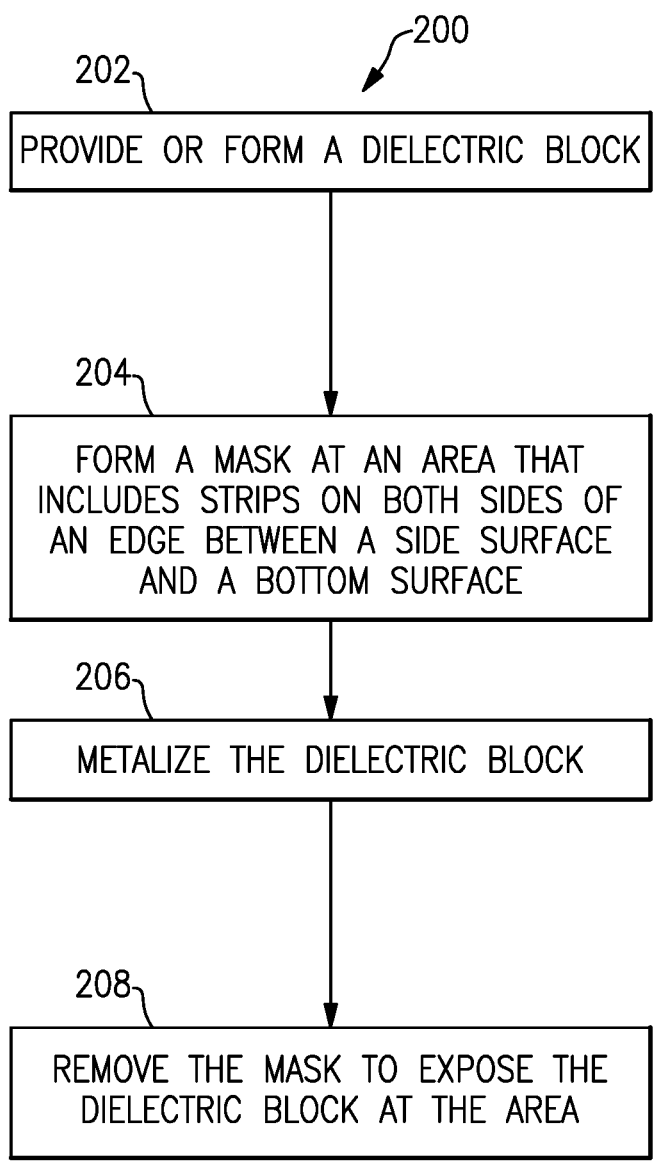
FIG. 8 shows a process that can be implemented to fabricate a waveguide device having one or more features as described herein.
Figure 9:
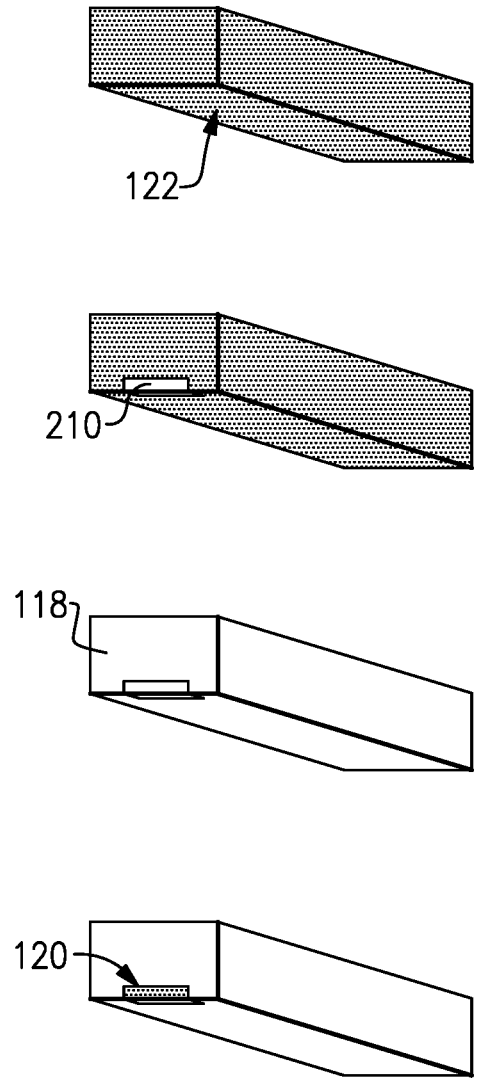
FIG. 9 shows examples of various stages corresponding to the process of FIG. 8.

FIG. 8 shows a process 200 that can be implemented to fabricate a waveguide device having one or more features as described herein. FIG. 9 shows examples of various stages corresponding to the process 200 of FIG. 8.

In FIG. 8, at block 202, a dielectric block can be provided or formed. In FIG. 9, such a dielectric block is indicated as 122. In FIG. 8, at block 204, a mask can be formed at an area that includes strips on both sides of an edge between a side surface and a bottom surface. In FIG. 9, such a mask is indicated as 210. In FIG. 8, at block 206, the dielectric block can be metalized. In FIG. 9, such metallization is indicated as 118. In FIG. 8, at block 208, the mask can be removed to expose the dielectric block at the masked area. In FIG. 9, such an exposed area of the dielectric block is indicated as an opening 120. Although not shown in FIG. 9, it will be understood that a similar opening can be formed at the other end of the waveguide device.

FIG. 10 shows another process 220 that can be implemented to fabricate a waveguide device having one or more features as described herein. FIG. 11 shows examples of various stages corresponding to the process 220 of FIG. 10.

In FIG. 10, at block 222, a dielectric block can be provided or formed. In FIG. 11, such a dielectric block is indicated as 122. In FIG. 10, at block 224, the dielectric block can be metalized substantially completely. In FIG. 11, such metallization is indicated as 118. In FIG. 10, at block 226, metallization can be removed to expose the dielectric block at an area that includes strips on both sides of an edge between a side surface (e.g., an end surface) and a bottom surface. In FIG. 11, such an exposed area of the dielectric block is indicated as an opening 120. Although not shown in FIG. 11, it will be understood that a similar opening can be formed at the other end of the waveguide device.

Figure 12:
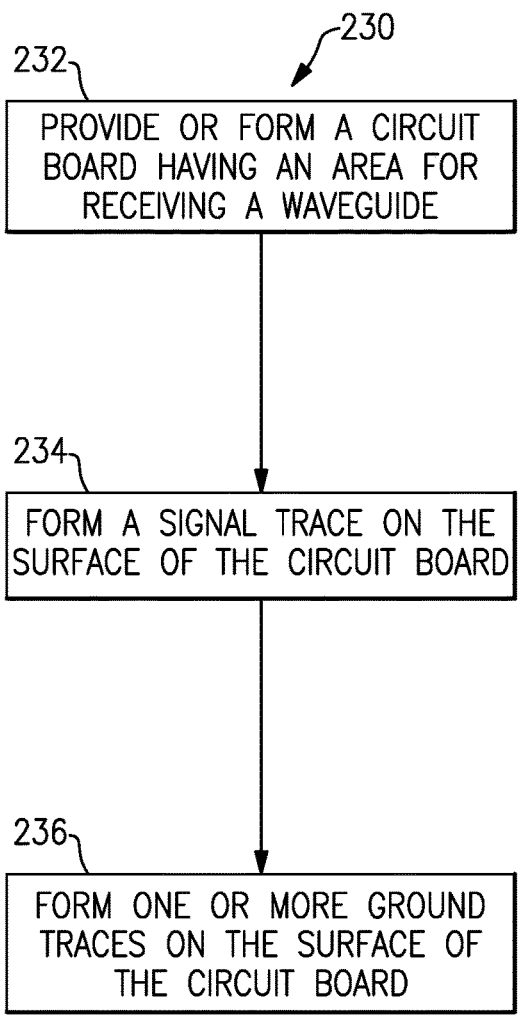
FIG. 12 shows a process that can be implemented to fabricate or configure a circuit board for receiving a waveguide device having one or more features as described herein.
Figure 13:
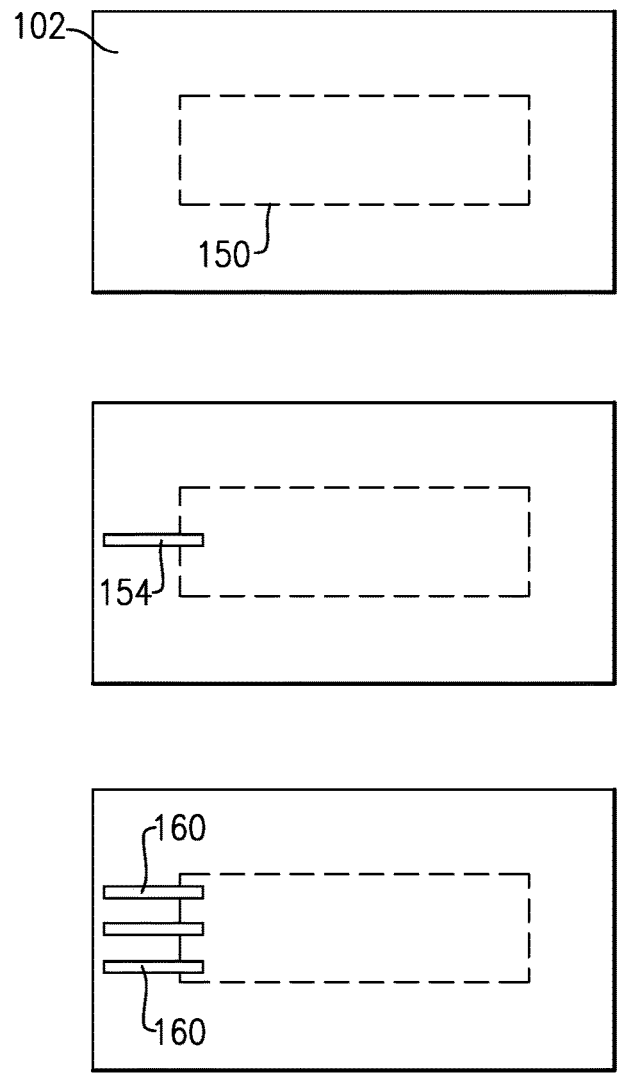
FIG. 13 shows examples of various stages corresponding to the process of FIG. 12.

FIG. 12 shows a process 230 that can be implemented to fabricate or configure a circuit board for receiving a waveguide device having one or more features as described herein. FIG. 13 shows examples of various stages corresponding to the process 230 of FIG. 12.

In FIG. 12, at block 232, a circuit board having an area for receiving a waveguide can be provided or formed. In FIG. 13, such a receiving area on a circuit board 102 is indicated as 150. In FIG. 12, at block 234, a signal trace can be formed on the surface of the circuit board. In FIG. 13, such a signal trace is indicated as 154. In FIG. 12, at block 236, one or more ground traces can be formed on the surface of the circuit board. In FIG. 13, such ground traces are indicated as 160. Although not shown in FIG. 13, it will be understood that similar signal and ground traces can be formed at the other end of the receiving area.

Figure 14:
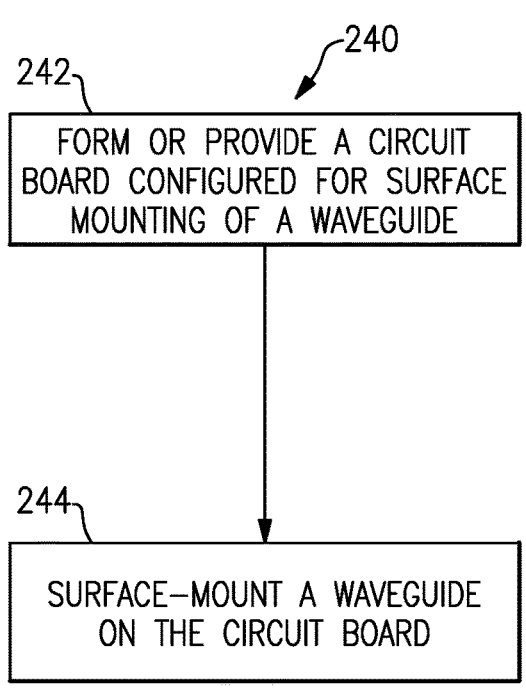
FIG. 14 shows a process that can be implemented to mount a waveguide device having one or more features as described herein.
Figure 15:
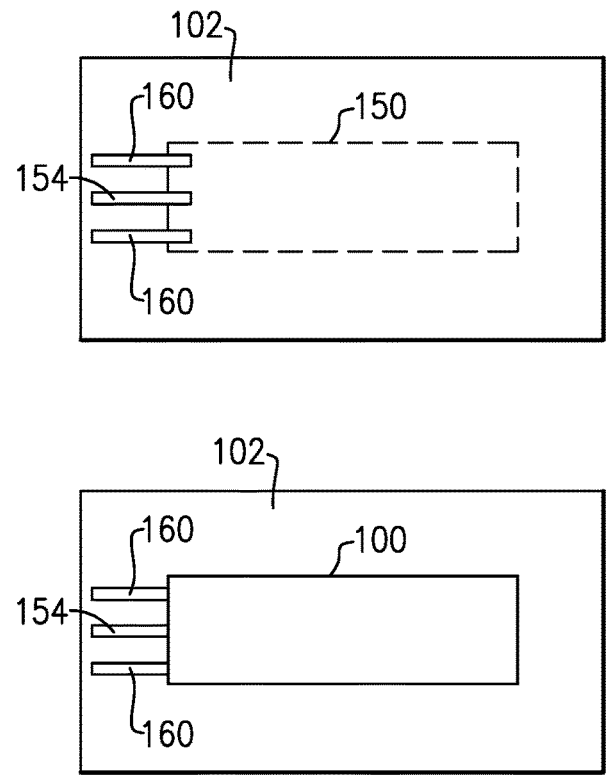
FIG. 15 shows examples of various stages corresponding to the process of FIG. 14.

FIG. 14 shows a process 240 that can be implemented to mount a waveguide device having one or more features as described herein on a circuit board such as the example of FIGS. 12 and 13. FIG. 15 shows examples of various stages corresponding to the process 240 of FIG. 14.

In FIG. 14, at block 242, a circuit board configured for surface mounting of a waveguide can be formed or provided. In FIG. 15, such a circuit board is indicated as 102. As described herein, and as shown in FIG. 15, such a circuit board can include a receiving area 150 for mounting of a waveguide, as well as signal and ground traces 154, 160. In FIG. 14, at block 244, a waveguide can be surface-mounted on the circuit board. In FIG. 15, such a waveguide is indicated as 100.

In the various examples associated with FIGS. 5A-5E and 6-15, it is assumed that a waveguide device 100 has a wrap-around opening 120 at each of either or both ends of the waveguide device 100. It will be understood that a waveguide device having one or more features as described herein can include one or more wrap-around openings implemented in different configurations.

Figure 16:
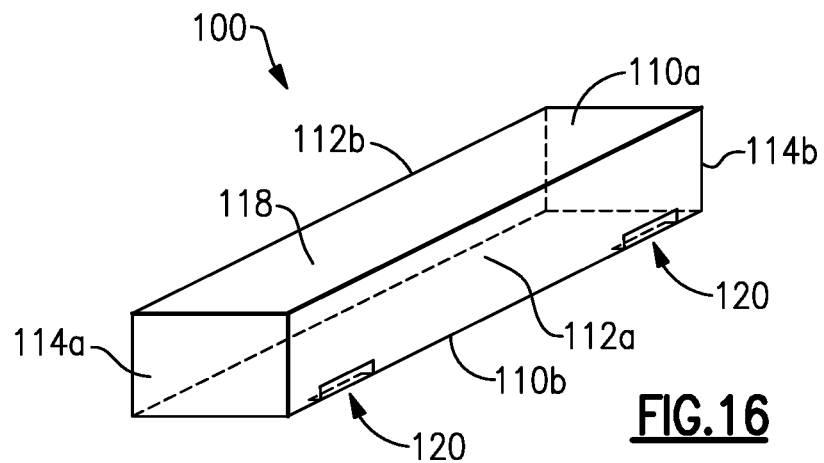
FIG. 16 shows that in some embodiments, a waveguide device can include one or more wrap-around openings along an edge that joins a side wall surface and a lower surface.

For example, FIG. 16 shows that in some embodiments, a waveguide device 100 can include one or more wrap-around openings 120 through a conductive layer 118 and along an edge that joins a side wall surface (e.g., 112a) and a lower surface 110b (opposite from an upper surface 110a). Such wrap-around openings 120 can allow the waveguide device 100 to be configured to be surface-mounted to a mounting substrate (such as a circuit board) as described herein. For example, each of the two example openings 120 can couple with conductor traces and contact features as described in reference to FIGS. 6 and 7, except such conductor traces and contact features can be configured to accommodate the side-facing openings 120. In the example of FIG. 16, an edge that joins the other side wall surface 112b and the lower surface 110b does not include any wrap-around opening.

In the example of FIG. 16, the wrap-around openings 120 can be implemented such that each opening is formed near the corresponding end (e.g., 114a or 114b) of the waveguide device 100. A separation distance between such wrap-around openings can be selected to yield one or more desired waveguide properties.

In the examples of FIGS. 5A-5E, 6-15 and 16, various wrap-around openings having one or more features as described herein are depicted as being implemented relative to one or more ends, or relative to one or more sides of the corresponding waveguide devices.

Figure 17:
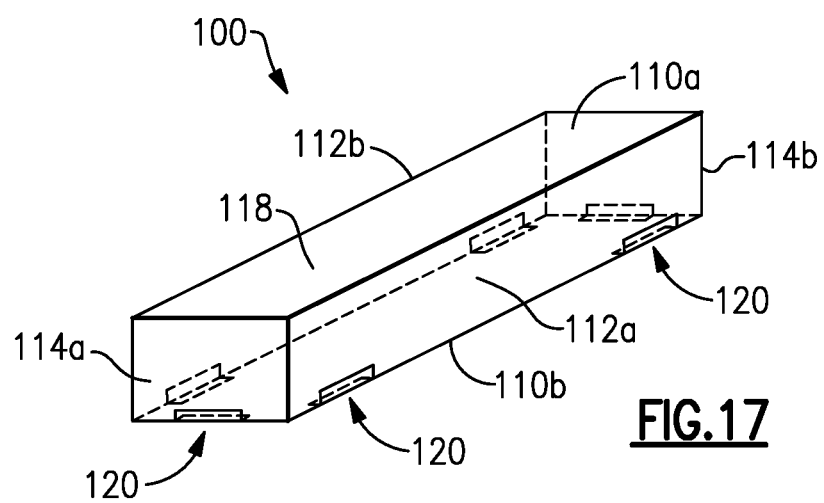
FIG. 17 shows that in some embodiments, a waveguide device can include a plurality of wrap-around openings implemented anywhere along the four edges associated with a lower surface of the waveguide device.

FIG. 17 shows that in some embodiments, a waveguide device 100 can include a plurality of wrap-around openings 120 through a conductive layer 118 and implemented anywhere along the four edges associated with a lower surface 110b (opposite from an upper surface 110a) of the waveguide device 100. In the example of FIG. 17, one or more wrap-around openings 120 are shown to be implementable on each of such four lower-surface edges. For example, in FIG. 17, one wrap-around opening 120 is shown to be implemented along an edge that joins an end wall 114a and the lower surface 110b, and another wrap-around opening is shown to be implemented along an edge that joins the other end wall 114b and the lower surface 110b. Further, two wrap-around openings 120 are shown to be implemented along an edge that joins a side wall surface 112a and the lower surface 110b, and two wrap-around openings are shown to be implemented along an edge that joins the other side wall surface 112b and the lower surface 110b.

For example, and as described in reference to FIGS. 5A-5E and 6-15, a wrap-around opening 120 can be implemented on each of the two end edges associated with the lower surface 110b.

In another example, and as described in reference to FIG. 16, a wrap-around opening 120 can be implemented near each end along a side edge associated with the lower surface 110b.

In yet another example, one wrap-around opening 120 can be implemented on an end edge of the lower surface 110b, and another wrap-around opening 120 can be implemented near an opposite end of a side edge of the lower surface 110b.

In yet another example, one wrap-around opening 120 can be implemented near an end of one side edge of the lower surface 110b, and another wrap-around opening 120 can be implemented near an opposite end of the other side edge of the lower surface 110b.

It will be understood that other configurations involving one or more wrap-around openings 120 can also be implemented. It will also be understood that while various examples are described herein in the context of the waveguide 100 having a rectangular block shape, one or more features of the present disclosure can also be implemented in waveguides having other shapes with a surface-mountable lower surface and side walls. For example, an L-shaped waveguide or a curved waveguide having features to accommodate one or more wrap-around openings can be benefit from one or more features as described herein.

Figure 18:
FIG. 18 shows that in some embodiments, one or more features of the present disclosure can be implemented in a radio-frequency (RF) component.

FIG. 18 shows that in some embodiments, one or more features of the present disclosure can be implemented in a radio-frequency (RF) component 300. Such a component can include, for example, an RF filter, an RF waveguide, an RF resonator, etc. Such a component can be implemented in a number of products, devices, and/or systems.

Figure 19:
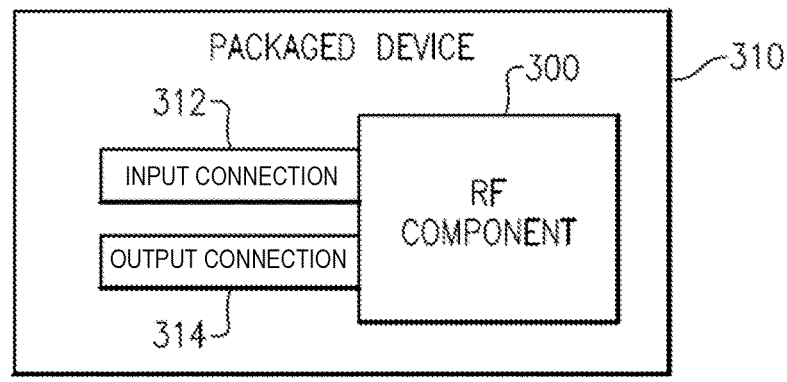
FIG. 19 shows that in some embodiments, a packaged device can include an RF component having one or more features as described herein.

For example, FIG. 19 shows that in some embodiments, a packaged device 310 can include an RF component 300 configured to be coupled to respective input and output connections 312, 314 to facilitate surface-mounting features as described herein. Such a packaged device can be configured to provide one or more of the foregoing functionalities associated with the RF component 300 of FIG. 18.

Figure 20:
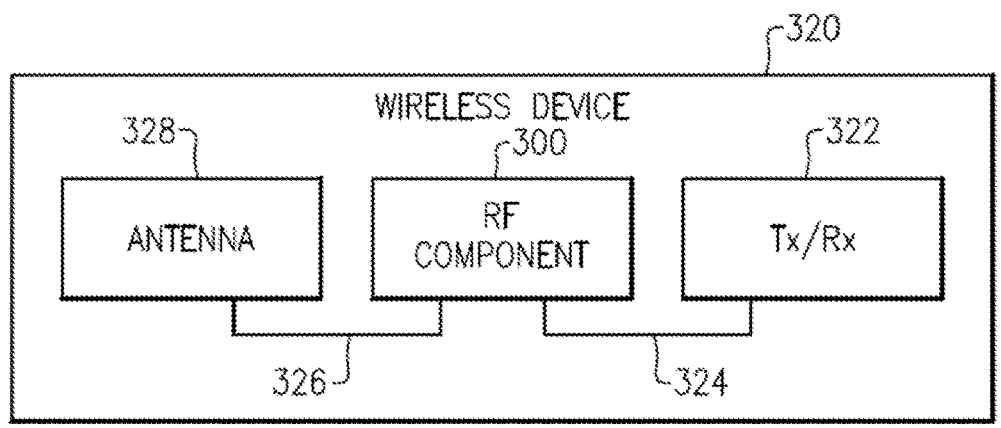
FIG. 20 shows that in some embodiments, an RF component having one or more features as described herein can be implemented in a wireless device.

FIG. 20 shows that in some embodiments, an RF component 300 having one or more features as described herein can be implemented in a wireless device 320. Such a wireless device can include an antenna 328 in communication with the RF component 300 (line 326). The wireless device 320 can further include a circuit 322 configured to provide transmit (Tx) and/or receive (Rx) functionalities. The Tx/Rx circuit 322 is shown to be in communication with the RF component 300 (line 324).

Figure 21:
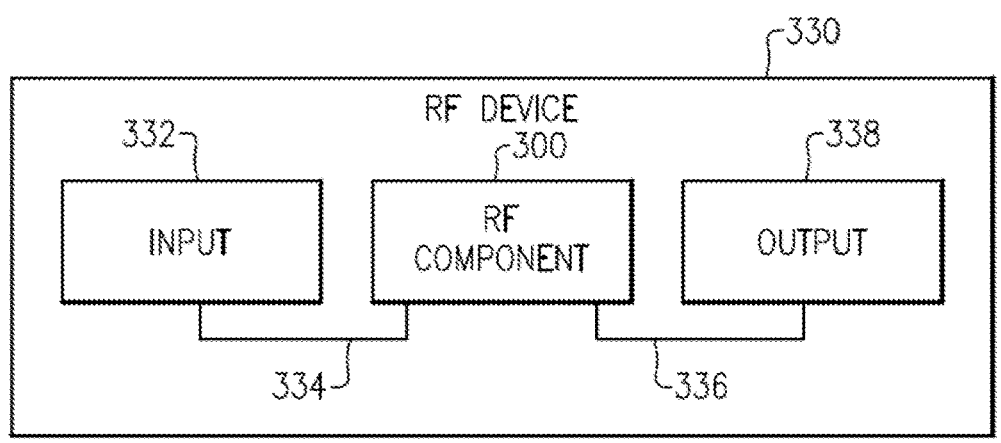
FIG. 21 shows that in some embodiments, an RF component having one or more features as described herein can be implemented in an RF device.

FIG. 21 shows that in some embodiments, an RF component 300 having one or more features as described herein can be implemented in an RF device 330. Such a device can include an input component 332 that provides an input RF signal to the RF component 300 (line 334), and an output component 338 that receives a processed RF signal (e.g., a filtered RF signal) from the RF component 300 (line 336). The RF device 330 can be a wireless device such as the example of FIG. 20, a wire-based device, or any combination thereof.

In some implementations, an RF component having one or more waveguide devices as described herein can be utilized in a number of applications involving systems and devices. Such applications can include but are not limited to cable television (CATV); wireless control system (WCS); microwave distribution system (MDS); industrial, scientific and medical (ISM); cellular systems such as PCS (personal communication service), digital cellular system (DCS) and universal mobile communications system (UMTS); and global positioning system (GPS). Other applications are also possible.

In the various examples described herein, terms "microwave" and "radio-frequency (RF)" are sometimes utilized interchangeably. It will be understood that one or more features of the present disclosure can be implemented with the broadest interpretation associated with either or both of such terms related to electromagnetic spectrum.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency device comprising:
a substrate having a surface;
a waveguide mounted on the surface of the substrate, the waveguide including a rectangular box shaped dielectric block and a conductive coating that substantially covers the dielectric block, the conductive coating defining a wrap-around opening that exposes an edge of the dielectric block in a contiguous manner to include portions of mounting and wall surfaces of the dielectric block;
a signal path implemented relative to the surface of the substrate, the signal path including an end configured to form an electrical contact with the conductive coating of the waveguide at a first location relative to the wrap-around opening of the conductive coating; and
a ground path implemented relative to the surface of the substrate, the ground path including an end configured to form an electrical contact with the conductive coating of the waveguide at a second location relative to the wrap-around opening of the conductive coating.

2. The radio-frequency device of claim 1 wherein the substrate is a packaging substrate or a printed circuit board.

3. The radio-frequency device of claim 1 wherein each of the signal path and the ground path is implemented substantially on the surface of the substrate.

4. The radio-frequency device of claim 3 wherein each of the signal path and the ground path is implemented as a conductive trace on the surface of the substrate to allow the waveguide to be mounted over a portion of the respective path.

5. The radio-frequency device of claim 1 wherein the wrap-around opening includes a strip on the wall surface along the edge and a strip on the mounting surface along the edge.

6. The radio-frequency device of claim 5 wherein a length of the strip on the wall is approximately the same as a length of the strip on the mounting surface.

7. The radio-frequency device of claim 5 wherein the first location associated with the end of the signal path is at or near a middle location along the length of the strip on the mounting surface.

8. The radio-frequency device of claim 7 wherein the second location associated with the end of the ground path is at or near one end of the strip on the mounting surface.

9. The radio-frequency device of claim 8 further comprising another ground path implemented relative to the surface of the substrate, the other ground path including an end configured to form an electrical contact with the conductive coating of the waveguide at a third location relative to the wrap-around opening of the conductive coating.

10. The radio-frequency device of claim 9 wherein the third location associated with the end of the other ground path is at or near the other end of the strip on the mounting surface.

11. The radio-frequency device of claim 1 wherein the rectangular box shape of the dielectric block has length, width and height dimensions, such that the length and width dimensions are associated with the mounting surface of the dielectric block, the length and height dimensions are associated with a side wall surface of the dielectric block, and the width and height dimensions are associated with an end wall surface of the dielectric block.

12. The radio-frequency device of claim 11 wherein the wrap-around opening includes portions of the mounting surface and the end wall surface.

13. The radio-frequency device of claim 11 wherein the wrap-around opening includes portions of the mounting surface and the side wall surface.

14. The radio-frequency device of claim 1 wherein the dielectric block includes ceramic material.

15. A substrate assembly comprising:
a substrate having a surface;
a ground trace implemented on the surface of the substrate, and including a contact end; and
a signal trace implemented on the surface of the substrate, and including a contact end, the signal trace configured to allow a rectangular box shaped waveguide with a contiguous wrap-around opening on a conductive coating to be mounted on the surface of the substrate such that the contact end of the signal trace is under the waveguide and electrically connected to a selected location of the conductive coating without shorting with another portion of the conductive coating.

16. The substrate assembly of claim 15 wherein the substrate is a packaging substrate or a printed circuit board.

17. The substrate assembly of claim 15 wherein the ground trace is configured such that the contact end thereof is under the waveguide and electrically connected to a grounding location on the conductive coating when the waveguide is mounted on the surface of the substrate.

18. A method comprising:
providing or forming a substrate having a surface;
implementing a ground trace on the surface of the substrate, such that the ground trace includes a contact end; and
forming a signal trace on the surface of the substrate, such that the signal trace includes a contact end, and such that the signal trace allows a rectangular box shaped waveguide with a contiguous wrap-around opening on a conductive coating to be mounted on the surface of the substrate such that the contact end of the signal trace is under the waveguide and electrically connected to a selected location of the conductive coating without shorting with another portion of the conductive coating.

19. The method of claim 18 further comprising mounting the waveguide on the surface of the substrate.

* * * * *